United States Patent [19]

Stepanenko et al.

[11] Patent Number: 4,545,229
[45] Date of Patent: Oct. 8, 1985

[54] METHOD FOR MANUFACTURING MICROWIRE AND DEVICE FOR EFFECTING SAME

[75] Inventors: Alexandr V. Stepanenko; Vladimir G. Voitov, both of Minsk; Stepan S. Klimenkov, Vitebsk; Svyatoslav A. Bartashevich; Viktor S. Karpitsky, both of Minsk, all of U.S.S.R.

[73] Assignee: Belorussky Politekhnichesky Institut, U.S.S.R.

[21] Appl. No.: 302,429

[22] Filed: Sep. 3, 1981

[51] Int. Cl.$^4$ .............................................. B21B 1/16
[52] U.S. Cl. ........................................ 72/73; 72/88; 72/91; 72/95
[58] Field of Search ................... 72/73, 74, 95, 88, 89, 72/91, 278, 285, 710, 64, 65

[56] References Cited

U.S. PATENT DOCUMENTS

| | | | |
|---|---|---|---|
| 133,452 | 11/1872 | Kellogg | 72/88 |
| 169,840 | 11/1875 | Prosser | 72/95 |
| 1,022,524 | 4/1912 | Wikstrom | 72/88 |
| 2,092,188 | 9/1937 | Simons | 72/89 |
| 2,279,350 | 4/1942 | Simons | 72/88 |
| 3,273,368 | 9/1966 | Sporck | 72/91 |

FOREIGN PATENT DOCUMENTS 735368  5/1980  U.S.S.R. ............................. 72/88

Primary Examiner—Lowell A. Larson
Attorney, Agent, or Firm—Burgess, Ryan & Wayne

[57] ABSTRACT

The invention relates to the rolling and drawing of metals. The microwire manufacturing method according to the invention is characterized in that a microwire blank (1) is rolled during the drawing process in opposite directions relative to the drawing axis (B—B). The blank (1) is rolled over the same distance equal to at least one half of its circumference. The method is carried out with the aid of a device comprising a body (3), a die (4) and a mechanism for drawing wire through the die (4). The die (4) is composed of two parts (5 and 6) which interact with the blank (1) as the latter is drawn between them. Each of the die parts (5 and 6) has a working surface (8). According to the invention, the parts (5 and 6) of the die (4) are secured in the body (3) so that they can be set in synchronized reciprocating motion in parallel planes. The working surfaces (8) of both parts (5 and 6) of the die (4) are flat and parallel with each other and the drawing axis (B—B).

8 Claims, 25 Drawing Figures

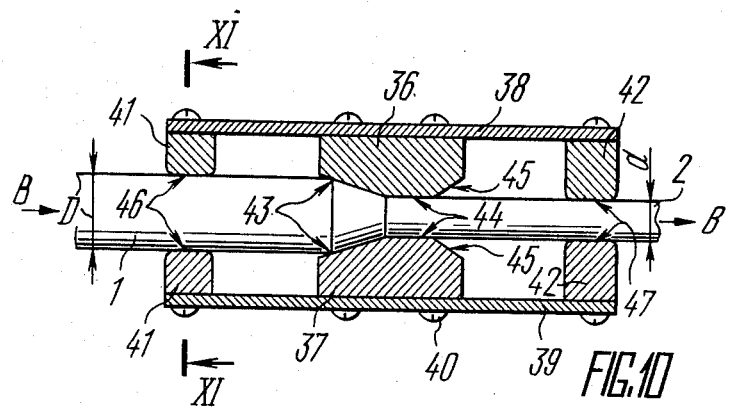
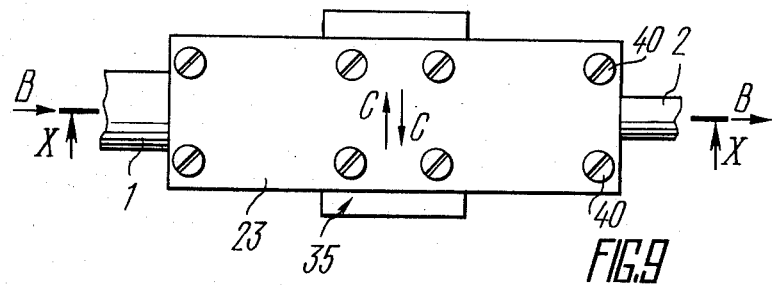
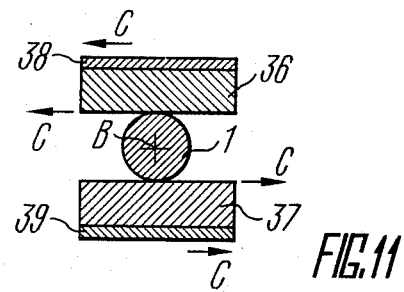

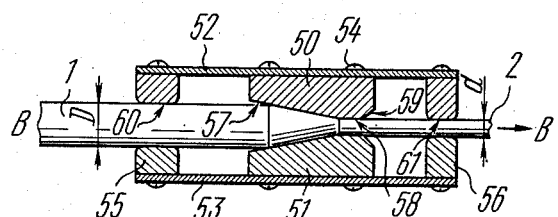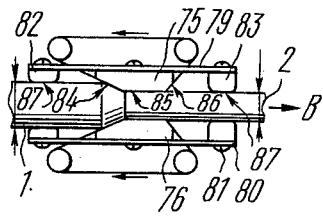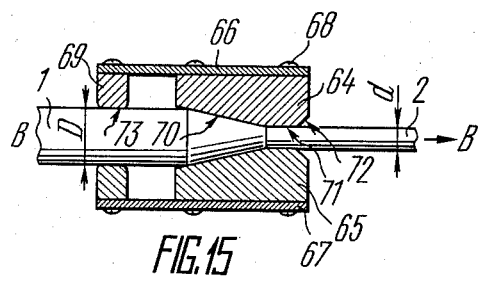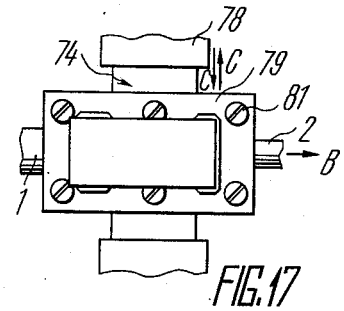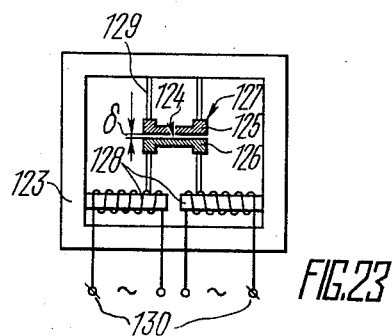

METHOD FOR MANUFACTURING MICROWIRE AND DEVICE FOR EFFECTING SAME

FIELD OF THE INVENTION

The present invention relates to rolling and drawing processes and, more particularly, to methods for manufacturing microwire and devices for carrying out such methods.

BACKGROUND ART

An analysis of the existing metal drawing techniques indicates that the amount of energy required to overcome the contact friction forces in the deformation zone increases with an increase in the specific surface of the blank, i.e. with a reduction in the diameter.

As a result, the degree of deformation effected in one pass is very small, which accounts for a low productivity and makes the drawing process totally inapplicable to the production of small-diameter microwire. There are also considerable difficulties involved in the fabrication of microwire drawing equipment.

The use of active lubricants, the polishing of the working surfaces of drawing dies and other measures of this kind do not significantly reduce contact friction forces.

Thus contact friction forces continue to be a limiting factor in microwire drawing processes.

Unlike the above-mentioned measures, contact friction forces can be significantly reduced by drastically reducing the area of contact between the die and the blank. This means changing the traditional drawing techniques.

Today there are two basic methods for the production of microwire less than 20 mu in diameter:
  pulling a microwire from a melt in a glass or ceramic sheath;
  drawing a microwire through hard-alloy, diamond and other equivalent dies.

When drawn in a sheath from a melt or an alloy, a microwire suffers from non-uniform cross-sectional dimensions. Such wire is further disadvantageous in that it has a cast structure and displays inferior mechanical properties. Finally, provision has to be made for chemical removal of the sheath.

It is very hard to manufacture a microwire less than 20 mu in diameter by drawing it through hard-alloy or diamond dies of conventional designs, bearing in mind the great specific surface, great amount of energy required to overcome friction forces, complexities involved in the die fabrication, and small deformation of the blank per pass.

A decrease in the diameter affects the mechanical strength of microwire; on the other hand, the specific surface and forces of friction increase. The factor which determines the minimum possible diameter of a microwire is the stretching strain.

The above problem can be solved only partially through the use of active lubricants, ultrasound, etc.

There is known a method for microwire manufacture, which consists of drawing a microwire blank through a die (cf. U.S. Pat. No. 3,955,390).

According to this method, twisted microwire is pulled through a die at whose outlet there are arranged rollers which discontinue the plastic twisting of the wire and thus prevent excessive plastic deformation.

Although twisting of the wire prior to the drawing process increases the yield strength of the wire in the course of twisting and the degree of deformation per pass, it provides only a partial solution to the problem of efficiency, bearing in mind that drawing metal through a die continues to be a complicated and time-consuming process.

The foregoing wire drawing method is carried out with the aid of a device (cf. FRG Application No. 2,449,474, Cl. B. 21C 3/06, of Jan. 15, 1976) comprising a body and a die composed of several parts arranged in the body and forming a drawhole through which a wire blank is pulled. The device also contains a wire drawing mechanism.

In the course of the drawing process, the wire blank interacts with the above-mentioned parts of the die, whereof each has an inlet surface, a working surface and an outlet surface.

The device further includes a number of adjustment means to control the spacing between individual parts of the die. As a wire blank is drawn through the die, it comes in contact with the entire surface of the deformation zone. Clearly, the device under review displays all the drawbacks inherent in dies in general. Much energy is required to overcome friction forces. Wire breakages are quite frequent. A small reduction per pass makes wire drawing an arduous and time-consuming process. Finally, a number of serious difficulties are involved in the die manufacture.

DISCLOSURE OF THE INVENTION

The invention essentially aims at providing a microwire drawing process and a device for effecting same, which would ensure an additional action on the wire blank in the course of drawing, simplify the drawing process and makes it possible to produce microwire with high mechanical properties, a superior surface finish, and a diameter smaller than that of microwire produced by conventional methods with the use of conventional equipment.

The foregoing object is attained by providing a microwire drawing method consisting in drawing a microwire blank through a die, which method is characterized, in accordance with the invention, in that in the course of the drawing process the blank is alternately rolled in opposite directions and over equal distances with respect to the drawing axis, said distances being equal to at least one half of the microwire blank's circumference.

The rolling of the blank with respect to the drawing axis makes it possible to produce microwire of a strictly round cross-section. For this purpose the blank has to be rolled in opposite directions with respect to the drawing axis over distances equal to at least one half of the blank circumference. As a result, the blank is reduced by one half of its circumference, which is greater than one half of the finished microwire's circumference; hence the microwire material is twisted.

In order to raise the yield strength of the microwire, increase the amount of deformation per pass, reduce the force required to pull the blank through the die, and improve the quality of the microwire, the blank is to be rolled at a perpendicular to the drawing axis.

Because of a difference in the diameters of the blank and finished microwire, the rolling of the blank brings about twisting of the microwire. The twisting of the microwire material, in turn, produces a strain in the blank, which reduces the working, normal and contact stresses in the deformation zone. This improves the mechanical characteristics of the microwire and hardens its surface layer.

In order to increase the amount of deformation per pass and eliminate stretching strain in the microwire material, the blank is rolled at an acute angle to the drawing axis without any change in the angle between the direction of rolling and drawing axis.

Rollinng the blank at an angle to the drawing axis produces a force component directed towards the die outlet: this allows the blank to move by itself and reduces stretching strain in the microwire material.

In order to reduce or fully eliminate twisting of the microwire and improve the quality of the microwire surface, the blank should be rolled along an arc whose center of curvature is found on the drawing axis. Thus the circumferential speed of rolling can be varied with a change in the blank diameter, which eliminates twisting and makes it possible to manufacture microwire from such low-plasticity materials as molybdenum, berylium, tungsten, niobium and others.

The present invention also provides a device for carrying out the microwire drawing method of this invention. The device comprises a body, a die, and a mechanism for pulling wire through the die. The die is composed of two parts secured in the body and interacting with the blank being drawn between them. Each of the die parts has an inlet surface, a working surface, and an outlet surface. The device according to the invention is characterized in that the die parts can be set in synchronized reciprocating motion in mutually parallel planes; the working surfaces of the die parts are flat and parallel with each other and the drawing axis.

This makes it possible to produce microwire of a round cross-section. The contact between the blank and the die parts is close to the linear, which considerably reduces the contact friction, decreases the amount of energy required to overcome friction, and increases the amount of deformation per pass. As a result, the microwire drawing process is made speedier and more efficient.

In order to increase the amount of deformation per pass and thus improve the quality of microwire, the die parts are made movable at a perpendicular to the drawing axis.

In order to allow production of microwire less than 20 mu in diameter with excellent mechanical properties, the die parts should be arranged at an acute angle, i.e. at an angle less than 90°, to the drawing axis. This angle remains unchanged while the die parts are in reciprocating motion. This also accounts for self-feeding of microwire. As the parts of the split die are set in reciprocating motion and act upon the blank, a force is produced which is directed along the drawing axis; this force sets the blank in motion and eliminates stretching strain in the microwire material.

In order to allow the manufacture of microwire from low-plasticity materials through reducing or completely eliminating twisting of wire in the deformation zone, the parts of the die are shaped as cylindrical sectors which can be set in reciprocating motion around their common center of curvature. This makes it possible to have different circumferentials speeds at the inlet of the die and thus prevent twisting of the wire.

In order to provide for self-feeding of microwire, it is expedient that a conveyor belt should be mounted on each part of the die. The belt is to be movable in the direction of the drawing; this rules out wire breakages by eliminating stretching strain in the microwire material.

In order to prevent slippage of a blank as it is rolled on the inlet and working surfaces of the die parts during the drawing process, each part of the die is elastically coupled to at least one element whose working surface is in contact with the blank and parallel with the drawing axis; the element and the respective die part are synchronously movable in parallel planes.

In addition to the main rolling forces produced as a result of the interaction between the blank and the die parts set in reciprocating motion in parallel planes, there is produced a couple of forces which prevents slippage during rolling and eliminates twisting of the blank during drawing. This increases the amount of deformation per pass and accounts for a regular geometrical shape of the microwire section and good quality of the wire surface.

It is highly expedient that synchronous reciprocating motion of the die parts towards each other should be effected with the aid of a shaft installed in the body of the device and composed of two halves; the plane of connection of the halves extends at an acute angle to the axis of the shaft. Each half of the shaft interacts with a respective part of the die. One half of the die is provided with a rotary drive. The second half of the shaft is provided with a mechanism which moves this half in the axis direction; it is also provided with springs, each having one end secured in the body, while the other end acts on the respective die part to press it against the respective half of the shaft.

Thus, axial motion of one half of the shaft results in a displacement of both halves with respect to each other in the plane of connection. The two halves of the shaft are connected at an acute angle to the shaft axis, so such displacements of the two halves of the shaft result in an elastic bending of the shaft ends which interact with respective parts of the die. The ends of the shaft are bent in opposite directions, so eccentricity is produced. The connection of the shaft halves, effected at an acute angle to the shaft axis, serves as a coupling. Bearing in mind that one half of the shaft is provided with a rotary drive, both halves can be set in synchronized rotation with a specified degree of eccentricity. This accounts for a desired length of a synchronized displacement of the die parts relative to each other. As pointed out above, the first ends of the springs are secured in the die body, while their second ends act on the the die parts; thus the die parts can be rapidly brought back to the initial position.

In addition; such a design makes it possible to produce microwire from blanks of different diameters and with different amounts of deformation per pass.

It is also preferred that the die parts should be made movable in parallel planes with the aid of flat springs arranged in the die body so that their wide sides are parallel with the drawing axis and extend at a perpendicular to the direction in which the die parts are set in motion, each spring has one of its ends secured in the die body, while its other end is coupled to a respective die part.

Thus secured, the flat springs produced, due to differences in rigidity, reciprocating displacements of the die parts in opposite directions in parallel planes; in other words, the flat springs perform the function of guides.

The use of flat springs as guides makes it possible to reduce the mass of movable and driven parts of the device, which, in turn, reduces the time lag of the system and rules out friction of the die parts against the body. This makes it possible to increase the frequency of synchronized reciprocating displacements, i.e. increase the drawing speed. What is equally important, this simplifies the design of the device and makes it more compact and reliable.

In order to make the device more versatile, it is preferred that the walls of the body, which extend to a perpendicular to the working parts of the die, should be movable in the plane perpendicular to the working surface of the die parts so as to vary the gap between the working surfaces.

According to an alternative embodiment of the invention the body walls, which extend at a perpendicular to the working surfaces of the die parts, have smaller cross-sectional dimensions than the remaining walls; the walls can be moved in the direction perpendicular to the working surfaces by applying external forces to them.

This accounts for an elastic deformation of the body walls at a perpendicular to the working surfaces of the die. The rigidity of the device is in no way impaired. Thus one can adjust the gap between the working surfaces of the die parts for a desired microwire diameter.

The gap is therefore continuously variable, which makes it possible to manufacture microwire within a broad range of gauges and improve the cross-sectional accuracy; in other words, this means a greater versatility of the device.

According to a still another embodiment of the invention, bimetallic supports are mounted on those walls of the body which extend at a perpendicular to the working surfaces of the die parts. The supports are parallel with the working surfaces; they are elastically coupled to the die parts and are movable at a perpendicular to the working surfaces when acted upon by a heat source.

This makes it possible to accurately adjust the gap between the working surfaces of the die parts by varying the temperature of the bimetallic supports; on the other hand, a constant temperature of the supports is a guarantee of a desired gap width and of a constant diameter of finished microwire.

A control of the temperature of the supports and a provision of a feedback makes it possible to automate the drawing process and raise its efficiency.

The objects of the invention are further attained by providing a device for carrying out the method according to the invention, which device comprises a body, a die, and a mechanism for pulling wire through the die. The die is composed of two parts secured in the body of the device and interacting with at least one pair of blanks drawn between them. The blanks are in a symmetric circumferential arrangement. Each die part has an inlet surface, a working surface, and an outlet surface. The device is characterized, according to the invention, in that the die parts are coaxially arranged in the body and can be set in synchronized reciprocating motion in parallel planes. The outer part of the die is a bushing whose internal surface is formed by the curvilinear inlet, working and outlet surfaces. The inner part of the die is cone-shaped and movable in the axial direction. The working surface of the outer part of the die is equidistant from the conical surface of the inner part.

Such a design makes it possible to increase the number of blanks drawn through the gap formed by the working surface of the bushing and the equidistant cone-shaped surface, which means a higher productivity.

Reciprocating motion of the die parts around a common axis of rotation accounts for a strictly round cross-section of microwire whose diameter is equal to the width of the gap formed by the working surface of the bushing and cone-shaped surface.

The possibility of displacing the die along the rotation axis and in relation to the working surface of the bushing makes it possible to vary the gap width and use one and the same device to turn out microwire of different diameters. This is another step in raising the versatility of the device.

BRIEF DESCRIPTION OF THE ACCOMPANYING DRAWINGS

A better understanding of the present invention will be had from a consideration of the following detailed description of preferred embodiments thereof, taken in conjunction with the accompanying drawings, wherein:

FIG. 9 is a cut-away view of a microwire drawing device in accordance with the invention, in which each of the die parts is elastically coupled to an additional element;

FIG. 10 is a sectional view taken on line X—X of FIG. 9;

FIG. 11 is a sectional view taken on line XI—XI of FIG. 10;

FIG. 13 is a section taken on line XIII—XIII of FIG. 12;

FIG. 15 is a section taken on line XV—XV of FIG. 14;

FIG. 16 is a cut-away view of a microwire drawing device in accordance with the invention, in which each die part is elastically coupled to an additional element and a microwire blank is rolled at a perpendicular to the drawing axis, a conveyor belt being mounted on each die part;

FIG. 17 is a plan view of the device of FIG. 16;

FIG. 23 is a general view of a microwire drawing device in accordance with the invention, incorporating bimetallic supports;

BEST MODE FOR CARRYING OUT THE INVENTION

Figure 1:
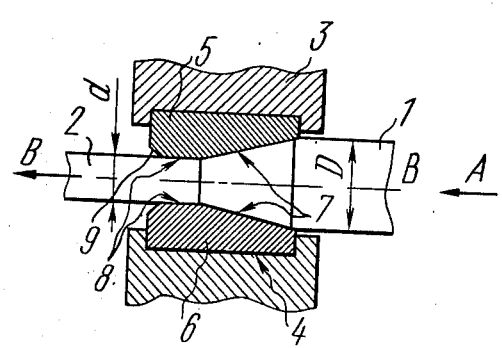
FIG. 1 is a cut-away elevation view of a microwire drawing device in accordance with the invention, in which a microwire blank is rolled at a perpendicular to the drawing axis.

The microwire drawing process according to the invention is schematically represented in FIG. 1. The process consists in drawing a microwire blank 1 of a diameter D in the direction of the arrow B through a die 3. The direction shown by the arrow B coincides with the drawing axis B—B. The end product is microwire 2 having a diameter d.

According to the invention, the blank 1 is alternately rolled during drawing in the direction indicated by the arrows C (FIG. 2) relative to the drawing axis B—B (represented by points B in the drawing) over a distance S equal to at least one half of the circumference of the blank 1. This makes it possible to obtain a geometrically regular cross section of microwire 2 with a diameter d.

The blank 1 is alternately rolled in opposite directions along the arrows C at a perpendicular to the drawing axis B—B. The result is microwire 2 of a round section with a diameter d.

As the blank 1 of a diameter D is rolled at a perpendicular to the drawing axis B—B, it is reduced by a value S equal to at least one half of the circumference of the blank 1, i.e. $S \geq (\pi D)/2$, which is greater than one half of the circumference of finished microwire 2 with a diameter d. The material of the microwire 2 is twisted due to a difference between the diameter D of the blank 1 and the diameter d of the microwire 2. The resultant strain in the material of the blank 1 reduced normal contact stresses in the deformation zone, increases the amount of deformation per pass, improves the quality of the microwire 2 and reduces the drawing force.

Figure 2:
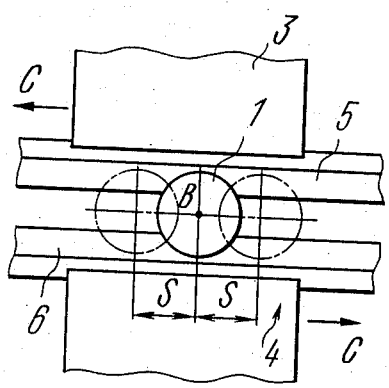
FIG. 2 is a view taken in the direction of arrow A of FIG. 1.

In FIG. 2, the dot-and-dash line shows two extreme positions of the blank 1 as it is rolled over a distance S.

Figure 3:
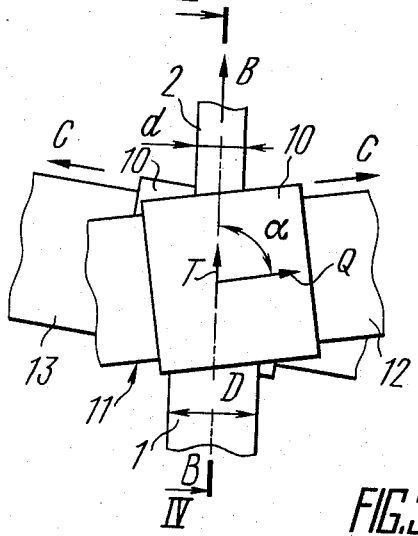
FIG. 3 is a cut-away elevation view of a microwire drawing device in accordance with the invention, in which a microwire blank is rolled at an acute angle to the drawing axis.

As shown in FIG. 3, the blank 1 with a diameter D is rolled back and forth in the directions indicated by the arrows C at an acute angle α to the drawing axis B—B. This produces a forced T directed along the drawing axis B—B. The force T is a component of the rolling force Q directed as shown by the arrow C. As the blank 1 is rolled back and forth, the angle α between the direction of rolling and the drawing axis B—B remains unchanged.

This makes it possible to reduce or even fully eliminate the stretching strain in the material of the microwire 2 and thus rules out breakages of wire during drawing.

Figure 5:
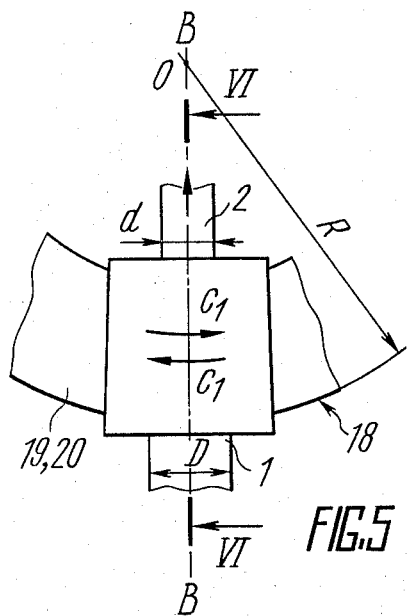
FIG. 5 is a cut-away view of a microwire drawing device in accordance with the invention, in which the die parts are cylindrical sectors.

As shown in FIG. 5, the blank 1 of a diameter D is rolled back and forth in the direction indicated by arrows C along a curve with a radius R and a center O of curvature which is found on the drawing axis B—B.

This makes it possible to roll the blank 1 at a variable speed and equal angular speeds. The linear speeds of the blank 1 and microwire 2 are directly related to the diameter D of the blank 1 and the diameter d of the microwire 2, respectively; this eliminates twisting and allows the manufacture of microwire 2 of a diameter d from low-plasticity materials.

According to FIGS. 1 and 2, the microwire drawing device of this invention comprises a body 3, a die 4 and a wire drawing mechanism (not shown). The die 4 is composed of two parts, 5 and 6, secured in the body 3 and interacting with the blank 1 of microwire 2 as it is drawn between them in the direction of the arrow B along the drawing axis B—B.

Each of the die parts 5 and 6 has an inlet surface 7 (FIG. 1), a working surface 8, and an outlet surface 9.

According to the invention, the die parts 5 and 6 can be set in synchronized reciprocating motion in parallel planes in the direction of the arrows C, i.e. parallel with the drawing axis B—B. The working surface 8 of the die parts 5 and 6 are flat and parallel to each other and to the drawing axis B—B. Thus the contact between the blank 1 and die 4 is close to the linear, which considerably reduces the drawing force, reduces losses of energy due to friction, and increases the amount of deformation per pass.

A round cross-section of microwire is produced through interaction between the blank 1 and the inlet surfaces 7 of the die parts 5 and 6. A round cross-section of microwire is formed gradually as the blank 1 is rolled back and forth over equal distances S from the drawing axis B—B. S is equal to at least one half of the circumference of the blank 1. The blank 1 is rolled as it is driven in the direction of the arrow B due to the reciprocating motion of the die parts 5 and 6 which are in contact with the blank 1.

The round cross-section of the blank 1 is finally formed by the working surfaces 8 of the die parts 5 and 6. The working surfaces 8 make the microwire surface smooth and ensure a desired diameter d of microwire 2.

Figure 4:
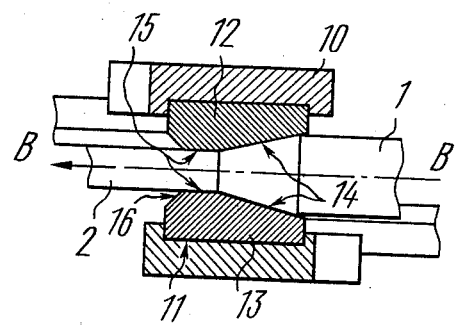
FIG. 4 is a view taken on line IV—IV of FIG. 3.

The device shown in FIGS. 3 and 4 comprises a body 10, a die 11, and a wire drawing mechanism (not shown). The die 11 is composed of two parts, 12 and 13. There is an acute angle α between the drawing axis B—B and the direction of reciprocating motion of the die parts 12 and 13, indicated by the arrow C. Reciprocating motion of the die parts 12 and 13 produces a force Q whereby the blank 1 is rolled along the arrow C. A component T of the rolling force Q is directed along the drawing axis B—B as indicated by the arrow B.

The die parts 12 and 13 are secured in the body 10 and interact with the blank 1 drawn between them. When alternately set in motion, the die parts 12 and 13 are at a constant acute angle α to the drawing axis B—B.

The above design eliminates stretching strain in the material of the microwire 2 and thus rules out breakages in the course of drawing.

Each of the die parts 12 and 13 has an inlet surface 14, a working surface 15, and an outlet surface 16. The working surfaces 15 are flat and parallel to each other and the drawing axis B—B.

Figure 6:
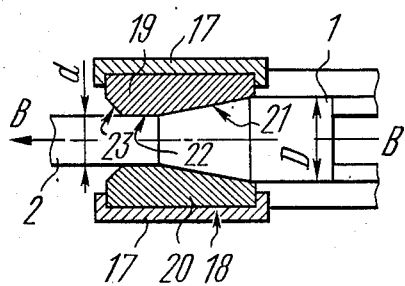
FIG. 6 is a view taken on line IV—IV of FIG. 5.

In order to produce microwire from low-plasticity materials, use is made of a device shown in FIGS. 5 and 6, which comprises a body 17, a die 18, and a wire drawing mechanism (not shown). The die 18 is composed of parts 19 and 20 which are secured in the body 17 and shaped as cylindrical sectors. The part 20 of the die 18 is not shown in FIG. 5.

Each of the die parts 19 and 20 has an inlet surface 21 (FIG. 6), a working surface 22, and an outlet surface 23. According to the invention, the working surfaces 22 are flat and parallel with each other and the drawing axis B—B.

As the blank 1 interacts with the die parts 19 and 20, it is rolled along a curve with a radius R and a center Q of curvature which is found on the drawing axis B—B. The radius R of the die parts 19 and 20 is derived from the formula:

$$R=(d\cdot l)/(D-d),$$

where l is the length of the inlet surfaces 21 of the die parts 19 and 20, projected on the drawing axis B—B.

Figure 7:
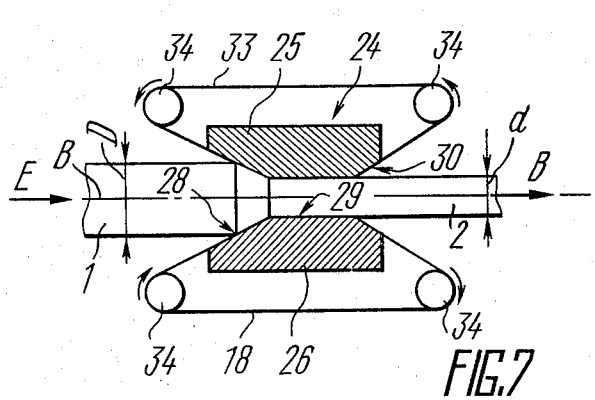
FIG. 7 is a cut-away elevation view of a microwire drawing device in accordance with the invention, in which a conveyor belt in mounted on each die part.

In the microwire drawing device shown in FIG. 7, the blank 1 is rolled at a perpendicular to the drawing axis B—B.

Figure 8:
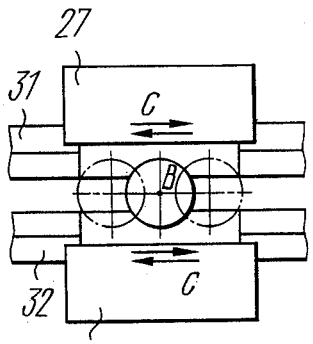
FIG. 8 is a view taken in the direction of arrow E of FIG. 7.

The device of FIG. 7 contains a die 24 composed of parts 25 and 26 which are supporting shoes secured in a body 27 (FIG. 8).

Each of the die parts 25 and 26 has an inlet surface 28, a working surface 29, and an outlet surface 30.

The working surfaces 29 of the die parts 25 and 26 are flat and parallel with each other and the drawing axis B—B. A conveyor belt 33 is mounted on each of the die parts 25 and 26. The belt 33 is tensioned and driven by drive rollers 34. The die parts 25 and 26, each carrying a respective belt 33, are both supporting shoes which can be set in synchronized reciprocating motion in the direction of the arrows C (not shown). The die parts 25 and 26 interact with the blank 1 drawn between them, whereby microwire 2 of a round cross-section and a diameter d is produced.

The belt 33 mounted on the die parts 25 and 26 serves as a carrying element to pull the blank 1 through the die 24 in the direction of the arrow B. The direction in which the belt 33 is driven is set by appropriately adjusting the drive rollers 34.

The above design eliminates stretching strain in the material of the microwire 2, which rules out breakages during drawing.

FIGS. 9, 10 and 11 show a microwire drawing device in accordance with the invention, in which the blank 1 is rolled at a perpendicular to the drawing axis B—B.

This device contains a die 35 (FIG. 9) composed of parts 36 and 37 (FIGS. 10 and 11), each elastically coupled through respective flat springs 38 and 39 and by means of fasteners 40 to respective pairs of elements 41 and 42 which are in contact with the blank 1 and microwire 2 (FIGS. 9, 10 and 11).

Each of the die parts 36 and 37 has an inlet surface 43, a working surface 44, and an outlet surface 45.

Depending on the diameter of the blank and its material, there may be one or more elements coupled to the die parts.

Each of the pairs of elements 41 and 42 has a working surface, 46 and 47, respectively.

The working surfaces 44 of the die parts 36 and 37 and the working surfaces 46 and 47 of the elements 41 and 42 are flat and parallel with each other and the drawing axis B—B.

The elements 41 and 42 are driven by the die parts 36 and 37 through the fasteners 40 and flat springs 38 and 39; thus the die parts 36 and 37 and the elements 41 and 42, coupled to the former, are set in synchronized reciprocating motion in the direction of the arrows C (FIGS. 9, 10 and 11). As this takes place, the die parts 36 and 37 and the elements 41 and 42 interact with the blank 1 drawn between them, whereby a large-diameter wire can be produced. Added to the main rolling force are pairs of forces applied in the direction of the arrows C (FIG. 11).

The foregoing design rules out slippage of the blank due to its own elasticity as it is rolled and twisted during the drawing process; the result is a better surface finish of microwire.

Figure 12:
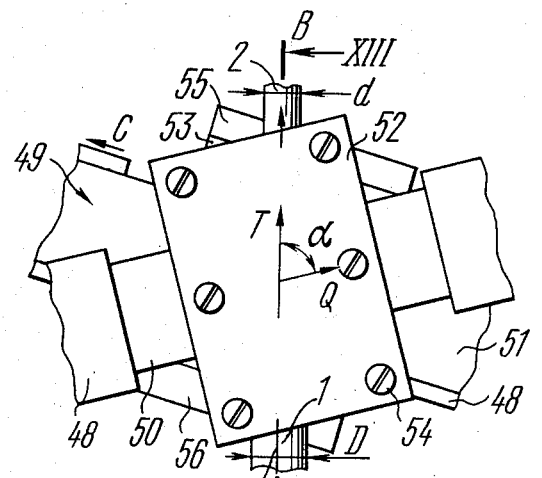
FIG. 12 is a cut-away view of a microwire drawing device in accordance with the invention, in which each of the die parts is elastically coupled to an additional element and a microwire blank is rolled at an acute angle to the drawing axis.

FIGS. 12 and 13 show a microwire drawing device in accordance with the invention, in which the blank 1 is rolled at an acute angle to the rolling axis B—B. The device comprises a body 48, a die 49, and a wire drawing mechanism (not shown). The die 49 is composed of parts 50 and 51 coupled through respective flat springs 52 and 53 by means of fasteners 54 to respective pairs of elements 55 and 56 which are in contact with the blank 1 and microwire 2.

The die parts 50 and 51 and the respective pairs of elements 55 and 56, coupled to the former through the flat springs 52 and 53 and by means of the fasteners 54, are arranged so that there is an acute angle α between the B—B axis and the direction (indicated by the arrows C) of reciprocating motion of the die parts 50 and 51.

This motion produces a force Q whereby the blank 1 is rolled. A component T of the rolling force Q is applied in the direction of the arrow B, i.e. along the drawing axis B—B.

Each of the die parts 50 and 51 has an inlet surface 57 (FIG. 13), a working surface 58, and an outlet surface 59.

Depending on the diameter of the blank and its material, there may be one or more elements coupled to the die parts.

The elements 55 and 56 have working surfaces 60 and 61, respectively.

The working surfaces 58 of the die parts 50 and 51 and the working surfaces 60 and 61 of the elements 55 and 56 are flat and parallel with each other and the drawing axis B—B.

As the die parts 50 and 51 and the elements 55 and 56, coupled to the former through the flat springs 52 and 53 and by means of the fasteners 54, interact with the blank 1 during their reciprocating motion, there is always a constant acute angle α between them and the drawing axis B—B.

This increases the force applied to the blank to roll it in the direction of the arrow C, rules out slippage of the blank due to its own elasticity as the blank is rolled and twisted during drawing, and thus improves the surface finish of the microwire.

Figure 14:
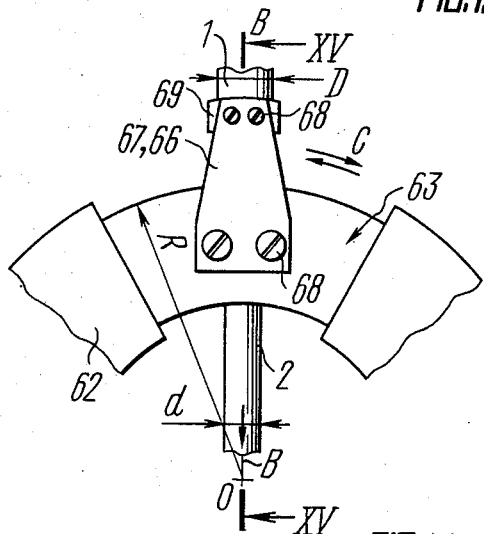
FIG. 14 is a cut-away view of a microwire drawing device in accordance with the invention, in which each die part is elastically coupled to an additional element and a microwire blank is rolled along a curve whose center of curvature is on the drawing axis.

FIG. 14 shows a microwire drawing device in accordance with the invention, in which the blank 1 is rolled, as indicated by the arrows C, along a curve with a radius R and a center O of curvature found on the drawing axis B—B. The device comprises a body 62, a die 63, and a wire drawing mechanism (not shown). The die 63 is composed of parts 64 and 65 (FIG. 15) coupled through respective flat springs 66 and 67 and by means of fasteners 68 to respective parts of elements 69 which are in contact with the blank 1 and microwire 2.

Each of the die parts 64 and 65 has an inlet surface 70, a working surfac 71, and an outlet surface 72.

Depending on the diameter and material of the blank 1, there may be one or more elements 69 coupled to the die parts 64 and 65.

Each of the elements 69 has a working surface 73.

The working surfaces 71 of the die parts 64 an 65 and the working surfaces 73 of the element 69 are flat and parallel with each other and the drawing axis B—B.

The elements 69 are driven by the die parts 64 and 65 through the fasteners 68 and flat springs 66 and 67, whereby the die parts 64 and 65 and elements 69 coupled to the former can be set in synchronized reciprocating motion in the direction of the arrows C (FIG. 14).

The die parts 64 and 65 and the elements 69 coupled to them interact with the blank 1 as the latter is rolled along a curve with a radius R and a center O of curvature found on the drawing axis B—B.

The radius R of the die parts 64 and 65 is calculated from the formula:

$$D=(D\cdot l)/(D-d),$$

where l is the length of the inlet surfaces of the die parts 64 and 65, projected on the drawing axis B—B.

The above design accounts for a greater force which rolls the blank in the direction of the arrows C; it also rules out slippage of low-plasticity blanks as they are rolled and twisted during the drawing process and thus improves the surface finish of microwire.

FIGS. 16 and 17 show a microwire drawing device in accordance with the invention, in which the blank 1 is rolled at a perpendicular to the drawing axis B—B.

The device contains a die 74 (FIG. 17) composed of parts 75 and 76 (FIG. 16) which are supporting shoes with a conveyor belt 77. The die parts 75 and 76 are secured in a body 78 (FIG.17) and elastically coupled through respective flat springs 79 and 80 and by means of fasteners 81 to respective pairs of elements 82 and 83 which are in contact with the blank 1 and microwire 2 (FIG. 16).

Each of the die parts 75 and 76 has an inlet surface 84 (FIG. 16), a working surface 85, and an outlet surface 86.

Depending on the diameter and material of the blank 1, there may be one or more elements 82 and 83 coupled to the die parts 75 and 76.

Each of the elements 82 and 83 has a working surface 87. The working surfaces 85 of the die parts 75 and 76 and the working surfaces 87 of the elements 82 and 83 are flat and parallel with each other and the drawing axis B—B.

The elements 82 and 83 are driven by the die parts 75 and 76 through the fasteners 81 and flat springs 79 and 80. As pointed out above, the die parts 75 and 76 are supporting shoes provided with a conveyor belt 77. Such a design provides for synchronized reciprocating motion of the die parts 75 and 76 and of the elements 82 and 83 coupled to the former, the motion being effected in the direction of the arrows C (FIG.17).

When set in motion, the die parts 75 and 76 and elements 82 and 83 interact with the blank 1 drawn between them, which accounts for a round cross-section of microwire 2 with a diameter d. The rolling force is produced by interaction between the blank 1 and die parts 75 and 76 set in reciprocating motion in parallel planes. The interaction between the elements 82 and 83 and the blank 1 increases the rolling force.

Such a design rules out slippage of blanks due to their own elasticity as blanks are rolled and twisted during the drawing process. The result is an improved surface finish of microwire.

Figure 18:
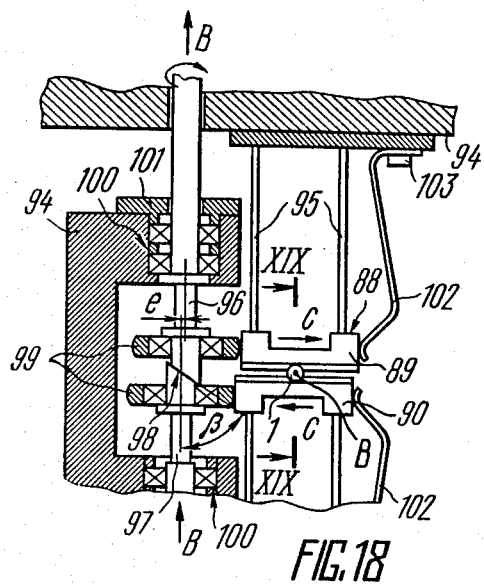
FIG. 18 is a cut-away elevation view of a microwire drawing device in accordance with the invention, in which reciprocating motion of the die parts is effected with the aid of a split shaft.
Figure 19:
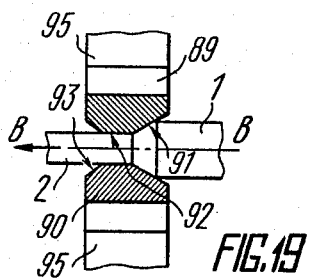
FIG. 19 is a section taken on line XIX—XIX of FIG. 18.

FIGS. 18 and 19 show a microwire drawing device in accordance with the invention, in which blanks are rolled at a perpendicular to the drawing axis B—B.

The device contains a die 88 composed of parts 89 and 90 which interact with the blank 1 as the latter is drawn between them in the direction of the drawing axis B—B represented by point B in the drawings.

Each of the die parts 89 and 90 has an inlet surface 91 (FIG. 19), a working surface 92, and an outlet surface 93. The die parts 89 and 90 are secured in a common body 94 and mounted on elastic elements, such as flat springs 95, so that they can be set in synchronized reciprocating motion in parallel planes in the direction of the arrows C, i.e. along the drawing axis B—B represented by point B in the drawings.

The device further incorporates a shaft secured in the body 94 and composed of two halves, 96 and 97. The plane 98 of connection of the shaft halves 96 and 97 extends at an acute angle B to the axis of the shaft.

Axial motion of the shaft half 97 is effected with the aid of an appropriate mechanism (not shown).

When the shaft half 97 is set in motion, the halve 96 and 97 are displaced with respect to each other in the plane 98 of connection. The latter extends at an acute angle to the axis of the shaft; as a result, the ends of the shaft halves 96 and 97 are elastically bent in opposite directions, which accounts for eccentricity "e".

Eccentrics 99 are mounted on the ends of the shaft halves 96 and 97 to make the interact with the die parts 89 and 90, respectively. The shaft halves 96 and 97 are installed in bearing supports 100 and have covers 101.

The shaft half 96 is set in rotation by a rotary drive (not shown). Rotation of the half 96 is transmitted through the plane 98 of connection to the shaft half 97 so that both rotate with a specified eccentricity "e". This provides for synchronized strokes of a specified length of the die parts 89 and 90.

The die parts 89 and 90 are brought back to their initial position by springs 102. First ends of the springs 102 are secured by means of fasteners 103 to the body 94; their secnd ends interact with the die parts 89 and 90.

A split shaft can also be used in cases when the blank is rolled at an acute angle to the drawing axis B—B or when it is rolled along a curve whose center of curvature is on the drawing axis B—B.

Figure 20:
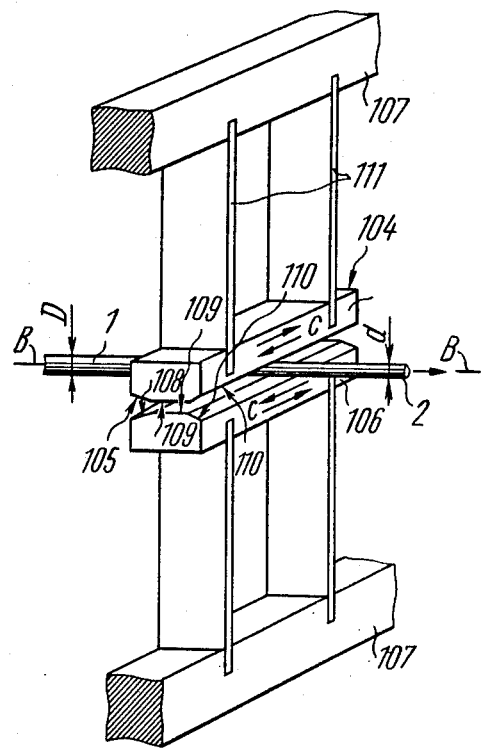
FIG. 20 is a cut-away axonometric view of a microwire drawing device in accordance with the invention, in which the die parts are driven in parallel planes by flat springs.

FIG. 20 shows a microwire drawing device in accordance with the invention, in which the blank is rolled at a perpendicular to the drawing axis B—B.

The device contains a die 104 composed of parts 105 and 106 which are secured in a body 107 and interact with the blank 1 drawn between them. Each of the die parts 105 and 106 has an inlet surface 108, a working surface 109, and an outlet surface 110. The die parts 105 and 106 are secured in the body 107 by means of flat springs 111. The first ends of the springs 111 are secured in the body 107; their second ends interact with the die arts 105 and 106. The flat springs 111 are arranged in the body 107 so that atheir broad sides are parallel with the drawing axis B—B and perpendicular to the direction of motion of the die parts 105 and 106, indicated by the arrows C.

A difference in rigidity provides for reciprocating motion of the die parts 105 and 106 in parallel planes along the arrows C; thu the flat springs 111 serve as guides.

A special mechanism (not shown) is provided to drive the die parts 105 and 106 in parallel planes in the direction of the arrows C.

FIG. 20 refers to a case when the flat springs 111 are used with the blank rolled at a perpendicular to the drawings axis B—B. However, they can also be used with the blank rolled at an acute angle to the drawing axis B—B or along a curve with a center of curvature on the drawing axis B—B.

Figure 21:
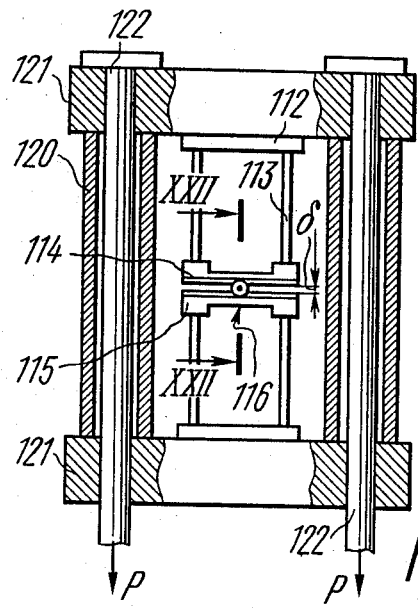
FIG. 21 is a cut-away elevation view of a microwire drawing device in accordance with the invention, in which some walls of the body have smaller cross-sectional dimensions than the others.
Figure 22:
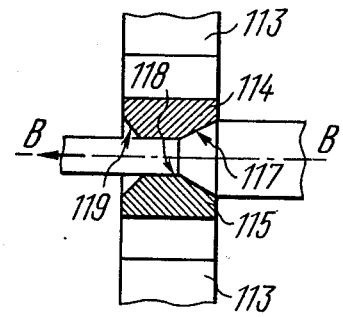
FIG. 22 is a section taken on line XXII—XXII of FIG. 21.

FIGS. 21 and 22 show a microwire drawing device in accordance with the invention, comprising a body 112 with elastic elements 113 which secure parts 114 and 115 of a die 116. Each of the die parts 114 and 115 has an inlet surface 117 (FIG. 22), a working surface 118, and an outlet surface 119. The working surfaces 118 are flat and parallel with each other and the drawings axis B—B. The body 112 has walls 120 which extend at a perpendicular to the working surfaces 118. The cross-sectional dimensions of the walls 120 are smaller than those of walls 121 of the body 112. The device also contains the rods 122 extending through the walls 120 at a perpendicular to the working surfaces 118. The tie rods 122 serve to bear and transmit loads to the walls 120.

In devices of the type shown in FIGS. 21 and 22, one and the same die 116 serves to produce microwire of a round cross-section and of different diameters, which is due to the fact that the gap δ between the working surfaces 118 is continuous variable.

The design of the latter device provides for elastic deformation of the walls 120 of the body 112 at a perpendicular to the working surfaces 118 without impairing the rigidity of the devices as a whole. Elastic deformation of the walls 120 is produced by external forces P applid to the tie rods 122, which makes the gap δ between the working surfaces 118 continuous variable and thus helps expand the range of microwire gauges and improve the accuracy of cross-section dimensions of microwire.

FIG. 23 refers to a microwire drawing device in accordance with the invention, comprising a body 123 and a die 127 composed of parts 125 and 126 with working surfaces 124. The device further includes bimetallic supports 128 which are parallel with the working surfaces 124 and elastically coupled to the die parts 125 and 126 by means of flat springs 129. The working surfaces 124 are flat and parallel with each other and the drawing axis B—B (not shown in the drawing).

A heat source 130 is used to transmit heat to the bimetallic supports 128, which produces elastic deformation in the plane between the working surfaces 124 of the die parts 125 and 126 and makes the gap δ between the working surfaces 124 continuously variable. This design expands the range of microwire gauges, improves the accuracy of the cross-sectional dimensions of microwire, and, if a feedback is provided, makes it possible to automatically control the microwire diameter.

Figure 25:
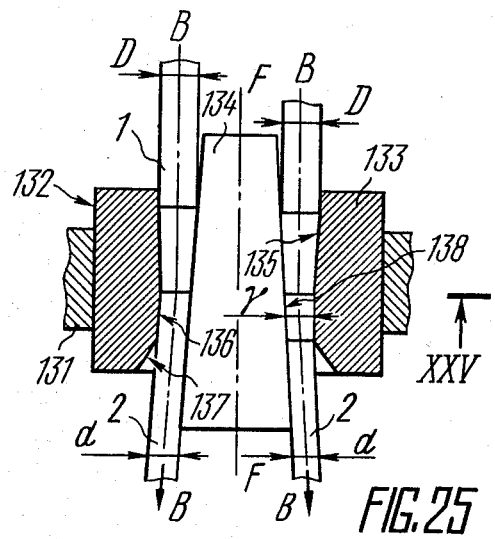
FIG. 25 is a view taken on line XXV—XXV of FIG. 24.
Figure 24:
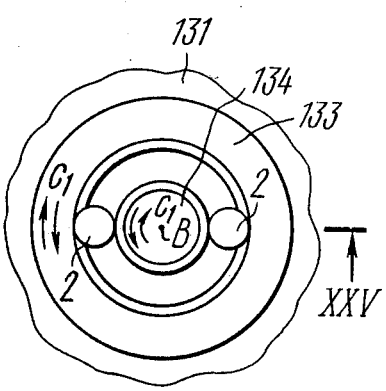
FIG. 24 is a view taken in the direction of drawing of a microwire drawing device in accordance with the invention, in which a number of blanks are drawn simultaneously.

FIGS. 24 and 25 show a microwire drawing device in accordance with the invention, in which a number of blanks can be drawn simultaneously.

The device comprises a body 131, a die 132 and a wire drawing mechanism (not shown). The die 132 is composed of parts 133 and 134 secured in the body 131 and interacting with blanks 1 drawn between them.

According to the invention, the die parts 133 and 134 are coaxial with the F—F axis. A special drive (not shown) sets them in synchronized reciprocating motion in parallel planes in the direction of the arrows $C_1$.

The external part 133 of the die 132 is a bushing whose internal surface is formed by an inlet surface 135 (FIG. 25), a working surface 136, and an outlet surface 137 which are all curvilinear. The internal part 134 of the die 132 is formed by a cone-shaped surface 138 and is axially movable with respect to the F—F axis. The working surface 136 of the external part 133 of the die 132 is equidistant from the cone-shaped surface 138 of the internal parts 134 of the die 132. There is a gap δ between the working surface 136 and the cone-shaped surface 138. The device makes it possible to draw a number of blanks through the gap δ, which means a greater productivity. The blank 1 of a diameter D is alternately rolled in opposite directions due to its interaction with the die parts 133 and 134. These are movable in the direction of the arrows 1 around a common axis F—F of rotation as blanks 1 are pulled through the gap δ whose width is equal to the diameter d of finished microwire 2. Displacing the die parts 133 and 134 along the F—F axis makes it possible to vary the gap δ and thus produce microwire of different diameters, wherefore the device becomes very versatile.

All the foregoing preferred embodiments incorporate drives to set the die parts in synchronized reciprocating motion. Such drives are not directly related to the subject of the invention and are therefore left out in the attached drawings.

Such drives may be of any type known to those skilled in the art, provided they can ensure the above-mentioned type of motion of the die parts.

The device of FIGS. 1 and 2 operates as follows.

The blank 1 of a diameter D is introduced into the gap between the working surfaces 8 of the die parts 5 and 6, whereupon it is secured on the reel of the wire drawing mechanism.

The gap between the working surfaces 8 is then adjusted for a desired diameter d of microwire 2.

The drive of the drawing mechanism and the drive which sets the die parts 5 and 6 in synchronized reciprocating motion are switched on.

As the blank 1 comes in contact with the inlet surface 7 and is pulled between the die parts 5 and 6, it is rolled back and forth and it diameter is reduced.

As the blank 1 is drawn through the gap between the working surfaces 8, it is reduced to microwire of a round cross-section and a desired diameter. The microwire surface becomes smooth.

The devices of FIGS. 3, 4, 5, 6, 7 and 8 operate in a similar manner, because they are of a similar design and are all intended to produce microwire of a round cross-section.

The device of FIGS. 9, 10 and 11 operates as follows.

A blank 1 of a diameter D is introduced into the gap between the working surfaces 44 of the die parts 36 and 37 and between the elastically interconnected working surfaces of the elements 41 and 42 coupled to the die parts 36 and 37 by the fasteners 40 and flat springs 38 and 39. The blank 1 is then secured on the reel of the wire drawing mechanism.

The gap between the working surfaces 44 of the die parts 35 and 37 is adjusted for a desired diameter of microwire 2. The gap between the working surfaces 46 and 47 of the elements 41 and 42 is set automatically due to elastic deformation of the flat springs 39 resulting from the contact of the working surfaces 46 and 47 of the elements 41 and 42 with the blank 1 of a diameter D and microwire 2 of a diameter d.

The drive of the wire drawing mechanism is switched on and so is the drive which sets the die parts 36 and 37 and the elements 41 and 42, coupled to the former by means of the flat springs 38 and 39 and fasteners 40, in synchronized reciprocating motion.

As the blank 1 is drawn between the die parts 36 and 37 and the elements 41 and 42, it comes in contact with the inlet surface 43; as a result, the blank 1 is rolled back and forth and its diameter is reduced.

As the blank 1 is drawn through the gap between the working surfaces 44, it acquires a round cross-section of a diameter d and a smooth surface. The elements 41 and 42, which are elastically coupled to the die parts 36 and 37, increase the force at which the blank 1 is rolled, eliminate slippage of the blank 1 and further smooth out the surface of microwire 2.

The devices of FIGS. 12, 13, 14, 15, 16 and 17 operate in a similar manner, because they are all of a similar design. All these devices are intended to produce microwire of a round cross-section and provide for an increased force at which the blank 1 is rolled in the course of the drawing process.

The device of FIGS. 18 and 19 operates as follows.

The blank 1 of a diameter D is introduced into the gap between the working surfaces 92 of the wire die parts 89 and 90 and secured on the reel of the wire drawing mechanism.

The axial displacement mechanism is then brought into play to set the eccentricity e of the halves 96 and 97 of the split shaft, which must be equal to at least one half of the circumference of the blank 1.

The gap betwween the working surfaces 92 is then set for a desired microwire diameter d. The drive to rotate the shaft is switched on. The shaft halves 96 and 97 interact through the eccentrics 99 with the die parts 89 and 90, whereby the latter are set in synchronized reciprocating motion.

Due to the elastic elements 95, synchronized reciprocating motion is performed in parallel planes.

As the wire drawing mechanism is switched on, the blank 1 is pulled through the die 88 and its diameter is reduced. The interaction of the die parts 89 and 90 with the blank 1 accounts for a round cross-section of finished microwire 2.

The device of FIG. 20 operates in a similar manner, because here, too, the blank 1 is rolled at a perpendicular to the drawing axis.

The device of FIGS. 21 and 22 differs from those described above in that prior to operation, a gap $\delta$, which is somewhat greater than the one required to produce microwire 2 of a diameter d, is set between the movable parts 114 and 155 of the die 116. The gap $\delta$ is set by appropriately adjusting the elastic elements 113. Fine adjustment of the gap $\delta$ is effected due to elastic deformation of the walls 120 of the body 112, which is perpendicular to the working surfaces 118 of the die 116. Elastic deformation is effected by forces P applied to the tie rods 122; as a result, the gap $\delta$ is accurately adjusted for a required diameter d of microwire 2.

The device of FIG. 23 operates in a similar manner, since in this case, too, fine adjustment of the gap $\delta$ is effected due to elastic deformation. In the device of FIG. 23, elastic deformation is produced with the aid of a heat source 130 which transmits heat to the bimetallic supports 128 secured to the body 123.

The device of FIGS. 24 and 25 operates as follows.

Four blanks 1 of a diameter D are introduced into the gap $\delta$ between the cone-shaped surface 138 and working surface 136. The blanks 1 are symmetrically spaced over a circumference so that the distance between adjacent blanks is equal to at least one half of the blank circumference.

The ens of the blanks are then secured on the reel of the wire drawing mechanism.

A required gap $\delta$ between the cone-shaped surface of the die part 134 and the working surface 136 of the die part 133 is set by moving the die part 134 along the axis F—F. The wire drawing mechanism is then switched on and so is the drive which sets the die parts 133 and 134 in synchronized reciprocating motion in relation to the common axis F—F.

The blanks 1 are rolled as they interact with the inlet surface 135 and working surface 136 of the external part of the die 132 and with the cone-shaped surface 1138 of the die part 134. Thus microwire 2 is produced of a round cross-section with a diamter d equal to the gap width $\gamma$.

The invention will be better understood from a consideration of the following examples showing the way the microwire drawing method according to the invention is carried out with the aid of the devices described above.

Example 1 refers to a microwire drawing process as claimed in claims 1 and 2, carried out with the aid of a device according to claims 5, 6, 7, 8, 9 and 10.

An aluminium blank has a dimater D equal to 22 mu. The drawing speed, V, is equal to 0.2 m/sec. The length of the die parts' stroke is $S \geqq 35$ mu. The reduction per pass is 33%.

Example 2 refers to a microwire drawing process as claimed in claim 3, carried out with the aid of a device according to claim 11.

Microwire with a diameter d=16 mu is produced from aluminium blanks having a diameter D=20 mu.

The speed at which the blank moves by itself between the die parts is V=0.1 m/sec. The length of the die parts' stroke is $S \geqq 32$ mu. The blank is rolled at an angle $\alpha = 82°$ to the drawing axis.

The reduction per pass is 36%.

Example 3 refers to a microwire drawing method as claimed in claim 4, carried out with the aid of a device according to claim 12.

Microwire with a diameter d=25 mu is produced from aluminium blanks with a diameter D=30 mu.

The drawing speed is V=0.2 m/sec. The length of the die parts' stroke is $S \geqq 48$ mu. The radius of the curve along which the blank is rolled is R=6 mm.

The reduction per pass is more than 30%.

The microwire drawing method according ro the present invention has a number of advantages over the conventional processes practiced in the USSR and other countries.

First, the method dispenses with a microwire sheath and makes it possible to manufacture microwire with a diameter of 20 mu and less at normal temperatures and pressures.

Second, the method according to the invention improves the quality of microwire, because it ensures a uniform strength and accurate cross-sectional dimensions of microwire.

Third, the method according to the invention considerably reduces the contact surface of the die and microwire and also reduces the drawing force.

In the fourth place, the method according to the invention increases the degree of reduction per pass.

In the fifth place, the invention facilitates the manufacture of wire drawing tools and makes them cheap, because they can be manufactured with the aid of conventional equipment from tool steel instead of such expensive materials as diamond, cubic boron nitride and others.

In the sixth place, the method according to the invention rules out wire breakges in the course of drawing.

COMMERCIAL APPLICABILITY

The invention is best applicable to the fabrication of semiconductor instruments and integrated microcircuits.

It can also be used to improve the surface finish of microwire produced by conventional methods.

We claim:

1. A device for manufacturing microwire comprising: a body, and a die comprising two parts which interact with a microwire blank as the latter is drawn between them, each of the die parts having an entry portion, a working surface and an exit portion said two parts having said surfaces facing each other and arranged within the body for parallel and opposed reciprocation, means to reciprocate said die parts in the form of a shaft, comprising two parts which meet in a connection plane, said connecting plane extending at an acute angle to the axis of the shaft, each part of the shaft interacting with a respective die part, one part of the shaft being coupled to a rotary drive and one part of the shaft having means to shift it along the axis of the shaft, and springs having first portions secured to the body and second portions which urge the die parts against the respective parts of the shaft.

2. A device as claimed in claim 1 wherein the die parts are movable perpendicular to the drawing axis.

3. A device as claimed in claim 1 wherein each die part is elastically coupled to at least one element having a working surface parallel with the drawing axis, on which working surface the element is in contact with the blank, so that the element and the part of the die, to which it is coupled, can be set in synchronized reciprocating motion in parallel planes.

4. A device of claim 1, wherein the die parts are coupled to the body of the device by means of flat springs arranged in the body so that their broad sides are parallel with the drawing axis and perpendicular to the direction of motion of the die parts, the first ends of the springs being secured in the body, their second ends being connected to the respective die parts.

5. A device of claim 5, wherein the walls of the body, perpendicular to the working surfaces of the die parts, are movable in a plane extending at a perpendicular to the working surfaces of the die so as to vary the gap between the working surfaces.

6. A device of claim 5, wherein the walls of the body which are perpendicular to the working surfaces of the die parts, have smaller cross-sectional dimensions than the other walls of the body and are movable perpendicular to the working surfaces of the die parts when acted upon by external forces.

7. A device of claim 5, wherein bimetallic supports are secured in the body parallel with the working surfaces of the die parts, said bimetallic supports are elastically coupled to the die parts by means perpendicular to the working surfaces, said bimetallic supports being provided with an independent heat source.

8. A device comprising a body and a die composed of two parts secured in the body and interacting with at least one pair of microwire blanks drawn between them, the blanks being symmetrically spaces over a circumference, each of the die parts having an entry surface, a working surface and an exit surface, the device further containing means for drawing wire through the die and a means to control the gap between the die parts, wherein the data parts are coaxially arranged in the body so that they can be set in synchronized reciprocating motion in parallel planes, the external die part being a bushing whose inner surface is formed by the entry surface, the working surface and the exit surface which are all curvilinear, the internal die part of the die being formed by a cone-shaped surface and being movable in the axial direction, the working surface of the external die part being equidistant from the cone-shaped surface of the internal die part.

* * * * *